(12) United States Patent
Liu et al.

(10) Patent No.: US 7,915,103 B2
(45) Date of Patent: Mar. 29, 2011

(54) METHOD FOR FABRICATING A FLAT PANEL DISPLAY

(75) Inventors: Chun-Yen Liu, Zhubei (TW); Chang-Ho Tseng, Tao-Yuan Hsien (TW)

(73) Assignee: Chimei Innolux Corporation (TW)

( * ) Notice: Subject to any disclaimer, the term of this patent is extended or adjusted under 35 U.S.C. 154(b) by 0 days.

(21) Appl. No.: 12/434,032

(22) Filed: May 1, 2009

(65) Prior Publication Data

US 2009/0215212 A1   Aug. 27, 2009

Related U.S. Application Data

(62) Division of application No. 11/432,116, filed on May 11, 2006, now abandoned.

(51) Int. Cl.
*H01L 29/04* (2006.01)
*H01L 27/146* (2006.01)

(52) U.S. Cl. ............ 438/166; 438/96; 438/97; 438/482; 438/486; 438/488; 257/49; 257/51; 257/52; 257/57; 257/59; 257/64; 257/66; 257/70; 257/72; 257/E27.132; 257/E29.289

(58) Field of Classification Search .............. 438/96–97, 438/166, 365, 417, 482, 486–489, 969; 257/49, 257/51–52, 57, 59–61, 64–75, E27.132, E21.412, 257/E29.289
See application file for complete search history.

(56) References Cited

U.S. PATENT DOCUMENTS

| | | | |
|---|---|---|---|
| 6,303,415 B1 | 10/2001 | Yamazaki | |
| 6,876,001 B2 | 4/2005 | Koo et al. | |
| 2002/0098695 A1* | 7/2002 | Hiraga et al. | 438/689 |
| 2004/0164306 A1* | 8/2004 | Hongo et al. | 257/88 |
| 2004/0169182 A1* | 9/2004 | Koo et al. | 257/83 |
| 2004/0192013 A1* | 9/2004 | Ryu et al. | 438/478 |
| 2004/0266078 A1* | 12/2004 | Kim | 438/166 |
| 2005/0054181 A1* | 3/2005 | Nakamura et al. | 438/486 |
| 2005/0087744 A1* | 4/2005 | Koo et al. | 257/72 |
| 2005/0199876 A1* | 9/2005 | Matsumoto | 257/64 |
| 2005/0277236 A1* | 12/2005 | Shimomura et al. | 438/166 |
| 2006/0001051 A1* | 1/2006 | Tai et al. | 257/213 |
| 2006/0006391 A1 | 1/2006 | Matsumura | |
| 2006/0175611 A1 | 8/2006 | Tanaka | |
| 2006/0270097 A1* | 11/2006 | Kim et al. | 438/82 |
| 2007/0243670 A1 | 10/2007 | Chen | |
| 2008/0087889 A1* | 4/2008 | Chan et al. | 257/40 |
| 2009/0146927 A1* | 6/2009 | Wan et al. | 345/76 |
| 2010/0117089 A1* | 5/2010 | Jung | 257/66 |
| 2010/0271349 A1* | 10/2010 | Liu et al. | 345/205 |

* cited by examiner

*Primary Examiner* — Matthew C Landau
*Assistant Examiner* — Maliheh Malek
(74) *Attorney, Agent, or Firm* — Thomas, Kayden, Horstemeyer & Risley, LLP

(57) ABSTRACT

The method for fabricating a flat panel display includes performing a first crystallization process to re-crystallize an amorphous silicon layer on a glass substrate to make the amorphous silicon layer become a polysilicon layer, forming a patterned absorbing layer to cover an active area pattern of a driving TFT and to expose portions of the polysilicon layer, performing a second crystallization process to re-crystallization the exposed portions of the polysilicon layer so that the exposed portions of the polysilicon layer has a different grain structure from the grain structure of the driving TFT, removing the patterned absorbing layer, and removing portions of the polysilicon layer to form an active area of the driving TFT and an active area of a switching TFT area in the exposed portions of the polysilicon layer of each sub-pixel.

8 Claims, 10 Drawing Sheets

Columnar grain structure

Dendrite grain structure

METHOD FOR FABRICATING A FLAT PANEL DISPLAY

CROSS-REFERENCE TO RELATED APPLICATIONS

This is a divisional application, which claims priority to U.S. patent application Ser. No. 11/432,116, filed on May 11, 2006.

BACKGROUND OF THE INVENTION

1. Field of the Invention

The invention relates to a method for fabricating a flat panel display that comprises thin film transistors with different carrier mobility.

2. Description of the Prior Art

An OLED uses organic luminous devices, such as organic light-emitting diodes, as the light source of the display. An organic luminous device is an electrically driven lighting element having a brightness that depends on the magnitude of a related current. The magnitude of the brightness, also called the gray-scale value, is controlled by the magnitude of the driving current of each sub-pixel, and the sub-pixels are arranged in a matrix or array in an OLED, which is called a matrix display. As a result, the OLED utilizes this characteristic of the organic luminous devices to generate red, blue, and green lights with different intensities of gray level to produce stunning images.

The matrix display is classified as a passive matrix or an active matrix display according to the driving method. Passive matrix displays adopt the method of driving the scan lines of the display in sequence, driving pixels in different rows sequentially. Since the light-emitting time of each pixel is restricted by the scanning frequency and the numbers of scan lines, the passive matrix method is not suitable for large-sized and high dots-per-inch (dpi) displays with a high amount of scan lines. In contrast, active matrix displays possess an independent sub-pixel circuit for each sub-pixel, which includes a capacitor (Cs), an organic light-emitting element, and at least two TFTs that are used to adjust the OLED driving current. With this arrangement, even in large-sized and high dpi displays, a steady driving current is provided for each sub-pixel.

FIG. 1 is a schematic diagram of an active matrix OLED panel 10 according to the prior art. As shown in FIG. 1, a panel display 12 comprises a matrix composed of a plurality of data lines 22 (such as D1, D2, and D3) and scan lines 24 (such as S1, S2, and S3). The panel display 12 also comprises a plurality of sub-pixel circuits 26, wherein each sub-pixel circuit 26 has at least two TFTs, a storage capacitor (Cs), and an organic light-emitting element 20 at each intersection of a data line 22 and a scan line 24. Each sub-pixel circuit 26 is electrically connected to a corresponding data line 22 and a corresponding scan line 24 for driving the organic light-emitting element 20 in the corresponding sub-pixel. The data lines D1, D2, and D3 connect to a data line driver 16 for receiving an image data signal, and the scan lines S1, S2, and S3 connect to a scan line driver 18 for receiving a switch/address signal.

FIG. 2 is a schematic diagram of the sub-pixel circuit 26 shown in FIG. 1. As shown in FIG. 2, the sub-pixel circuit 26 comprises a switching TFT 28, a driving TFT 30, and a storage capacitor 32. In the prior art, generally, the switching TFT 28 and driving TFT 30 are NMOS and PMOS transistors respectively. The gate of the switching TFT 28 is electrically connected to the scan line 24, and the source, point A, of the switching TFT 28 is electrically connected to the data line 22. In addition, the gate, point B, of the driving TFT 30 is electrically connected to the source of the switching TFT 28 and one end of the storage capacitor 32. The source, point C, and the drain, point D, of the driving TFT 30 are electrically connected to the organic light-emitting element 20 and an external power supply respectively.

The driving method of the conventional OLED panel 10 is described in the following. Referring to FIG. 1 and FIG. 2, when a video data signal is inputted into a control circuit 14, the control circuit 14 generates corresponding control signals to the data line driver 16 and the scan line driver 18 according to the video data of each sub-pixel. Then, the scan line driver 18 outputs corresponding scan signals to each scan line 24 (S1, S2, ... and Sn) in sequence for turning on the sub-pixel circuits 26 in each row in order and thereby making the corresponding pixels perform the display operation. For example, when the OLED panel 10 is going to drive a sub-pixel positioned in the intersection of D2 and S2, the control circuit 14 sends a scan signal through the scan line 22 to the gate of the switching TFT 28 of the sub-pixel circuit 26, and sends a corresponding data signal, normally a voltage signal with a predetermined intensity, to the drain of the switching TFT 28 through the data line driver 16 and the data line 22 according to the video data.

Since the switching TFT 28 conduct, the video data will charge the storage capacitor 32 to have a first voltage through the switching TFT 28 and generate a corresponding driving current at point C, which is then output to the organic light-emitting element 20 to make the light-emitting element 20 generate light beams with a corresponding brightness. When the OLED panel 10 performs in continuous operation, such as driving the sub-pixels in the next row, the storage capacitor 32 still has the first voltage although the voltage on scan line S3 decreases resulted in the switching TFT 28 becoming closed. Therefore, the driving TFT 30 still conducts. Furthermore, since there is a voltage difference between point D and point B, a current is continuously passing through the driving TFT 30 to the organic light-emitting element 20 to continuously keep the organic light-emitting element 20 emitting light beams.

In conclude, although a sub-pixel circuit may have various design structures of an AMOLED panel and the amount of TFTs in a sub-pixel circuit may be different, a sub-pixel circuit usually contains at least two TFTs for driving the organic light-emitting element, such as the driving TFT 30, and for switching the sub-pixel, such as the switching TFT 30. In the driving method of an OLED panel as described above, the sub-pixel circuit used for driving the organic light-emitting element is one of the key devices for displaying video data on time and correctly. Furthermore, since the driving TFTs and the switching TFTs control the switch of each sub-pixel and the organic light-emitting element of each sub-pixel, the quality of the switching TFTs and driving TFTs is a key factor in the performance of the OLED panel.

Generally, the switching TFTs and the driving TFTs are low temperature polysilicon (LTPS) TFTs and fabricated simultaneously with the same fabrication processes in the prior art. The polysilicon layer of the channel region of one LTPS TFT is formed under a low temperature. The prior-art method for forming the channel region includes using laser beams with various energies or utilizing a laser machine including a mask to mask and adjust the laser beams so as to form the polysilicon layer.

Since the switching TFTs and the driving TFTs have different functionalities in a sub-pixel, they actually require different electrical properties in operation. For example, one switching TFT is used for turning on its corresponding sub-pixel, and therefore it requires a high carrier mobility and a high driving current. On the other hand, a driving TFT is used to drive the organic light-emitting element and controls the brightness of the light beams of the organic light-emitting element in the sub-pixel. Accordingly, all the driving TFTs in the flat panel display should have similar driving capability, and the carrier mobility of the driving TFTs should be moderate for maintain the lifetime of the organic light-emitting elements longer. However, the channel regions of the driving TFTs and the switching TFTs are conventionally formed by a laser irradiation in the fabrication method of the prior art, thus the grain structures of the channel regions have a large carrier mobility, about 100 cm$^2$/V·s and a large deviation. Therefore, the driving TFTs including the grain structure of the channel regions with a large deviation may have different carrier mobility in a large range, which affect the organic light-emitting elements in all of the sub-pixels may have different brightness of largest magnitude. Since the driving TFTs have different driving currents in a large range, it is difficult for the whole flat panel display to have a brightness uniformity, which is called a mura problem. Furthermore, the lifetime of the organic light-emitting elements in each sub-pixel is hard to be controlled. Accordingly, the witching properties of the switching TFTs and the driving TFTs cannot be satisfied simultaneously.

SUMMARY OF THE INVENTION

It is therefore a primary objective of the claimed invention to provide a flat panel display and the fabrication method thereof to solve the above-mentioned problem.

Accordingly to the claimed invention, the method for fabricating a flat panel display comprises providing a substrate, forming an amorphous silicon layer on the substrate, performing a first crystallization process to re-crystallize the amorphous silicon layer so that the amorphous silicon layer becomes a polysilicon layer, forming a patterned absorbing layer in each sub-pixel of the flat panel display to define an active area pattern of a driving TFT of each sub-pixel and to expose portions of the polysilicon layer, performing a second crystallization process to re-crystallization the exposed portions of the polysilicon layer so that the exposed portions of the polysilicon layer have a different grain structure from the grain structure of the driving TFT, removing the patterned absorbing layer, and removing portions of the polysilicon layer to form an active area of the driving TFT and an active area of a switching TFT area in the exposed portions of the polysilicon layer of each sub-pixel.

It is an advantage of the claimed invention that the channel regions of the driving TFTs and the switching TFTs are formed with different crystallization processes. Therefore, the channel regions of the driving TFTs comprise a dendrite grain structure which has a low carrier mobility but a smaller standard deviation of the carrier mobility as compared that of the switching TFTs. Accordingly, all the driving TFTs provide similar currents to corresponding organic light-emitting elements in each sub-pixel so that the mura problem can be solved. Furthermore, since the channel regions of the switching TFTs comprise a columnar grain structure which has a high carrier mobility, all sub-pixels may have preferable response time.

These and other objectives of the present invention will no doubt become obvious to those of ordinary skill in the art after reading the following detailed description of the preferred embodiment that is illustrated in the various figures and drawings.

DETAILED DESCRIPTION

In a preferable embodiment of the present invention, the fabrication method is applied to fabricating a flat panel display, which is an active matrix OLED (AMOLED). However, in other embodiments, the present invention can be applied to an active matrix polymer light-emitting panel displays. The flat panel display comprises a periphery circuit area and a pixel array area, which includes a plurality of sub-pixels. Each of the sub-pixels comprises at least two TFTs and an organic light-emitting elements, wherein one of the TFTs is a driving TFT for driving the organic light-emitting element, and one of the TFTS is a switching TFT for switching the sub-pixel.

Figure 1:
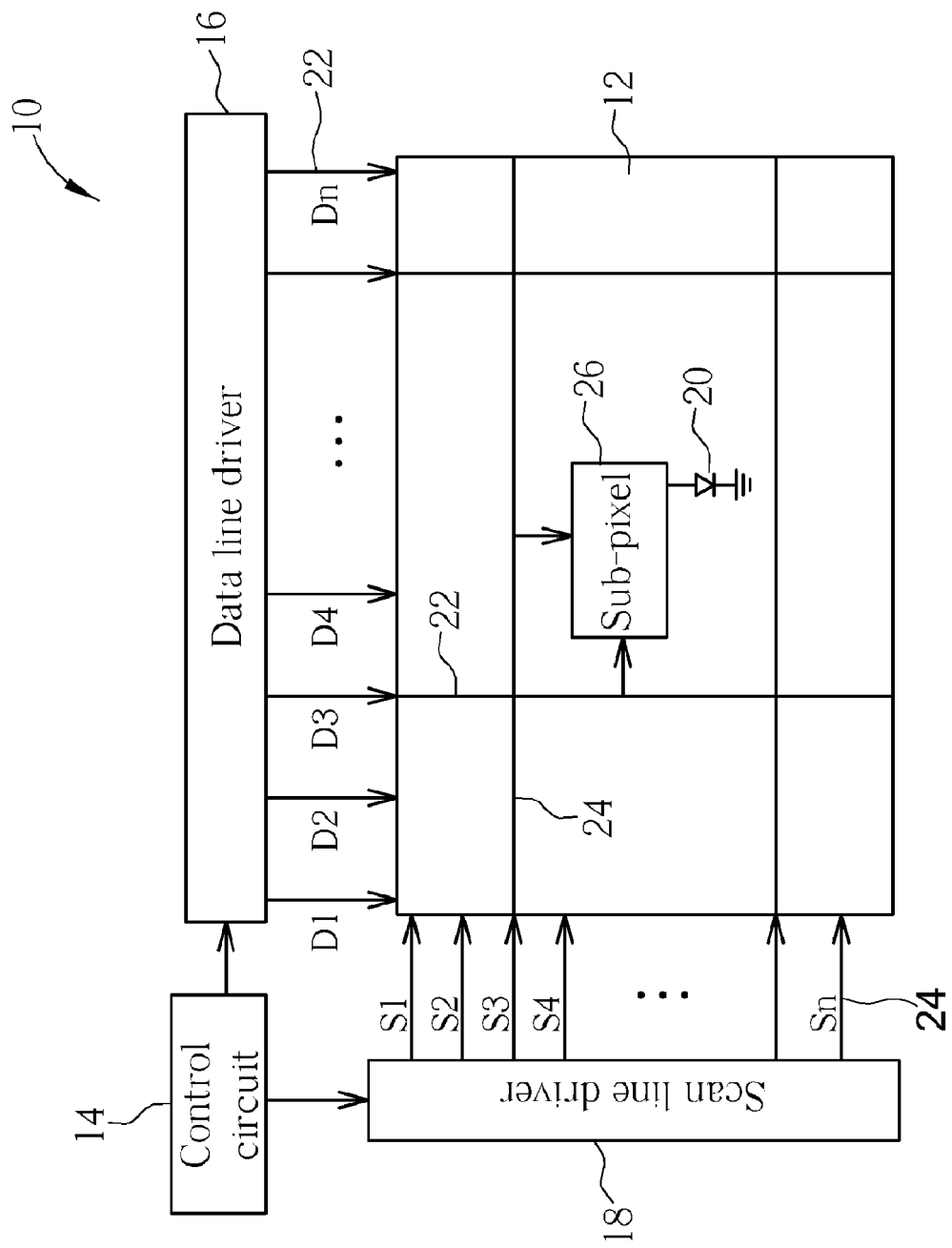
FIG. 1 is a schematic diagram of an active matrix OLED panel according to the prior art.
Figure 2:
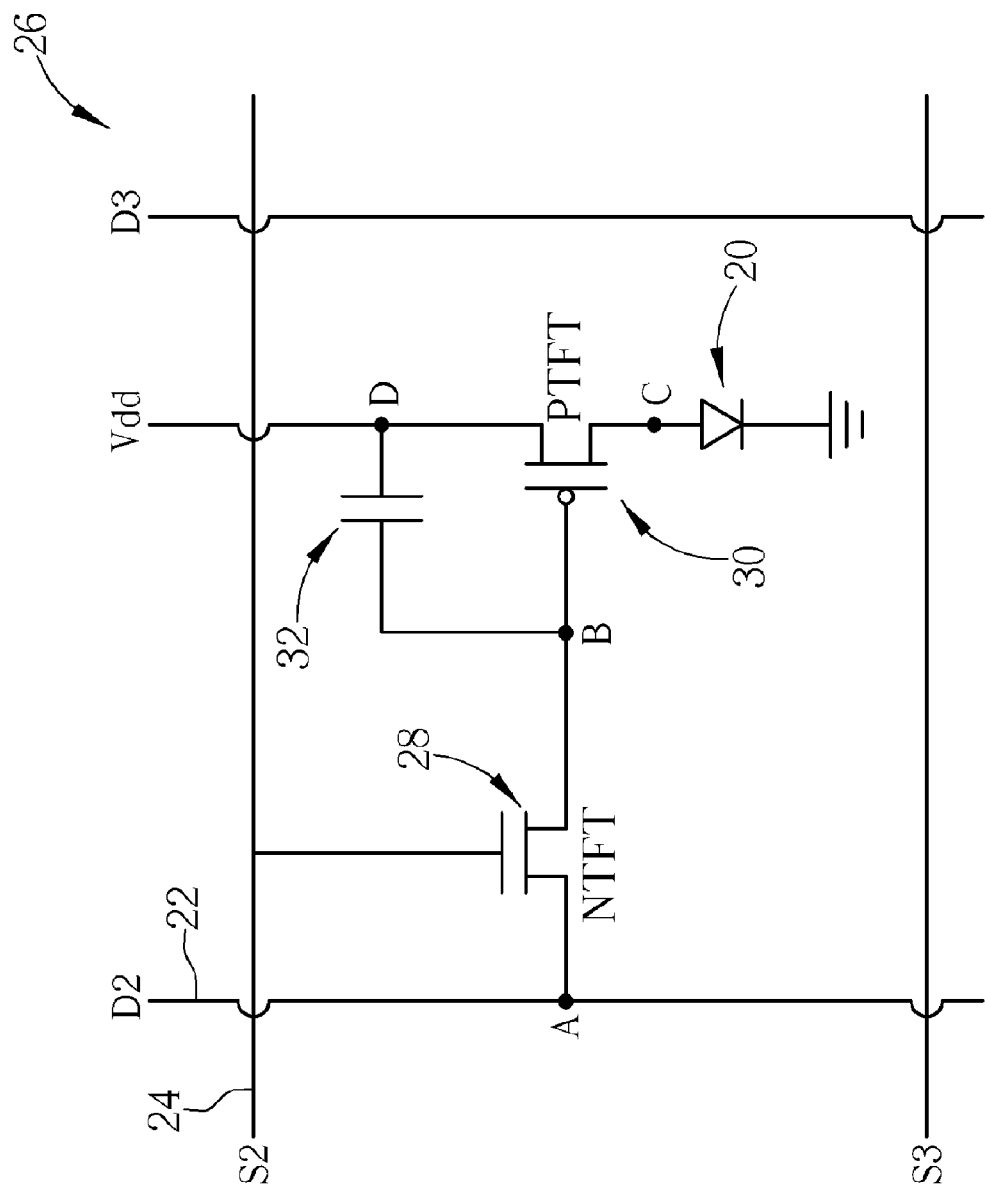
FIG. 2 is a schematic diagram of the sub-pixel circuit shown in FIG. 1.
Figure 3:
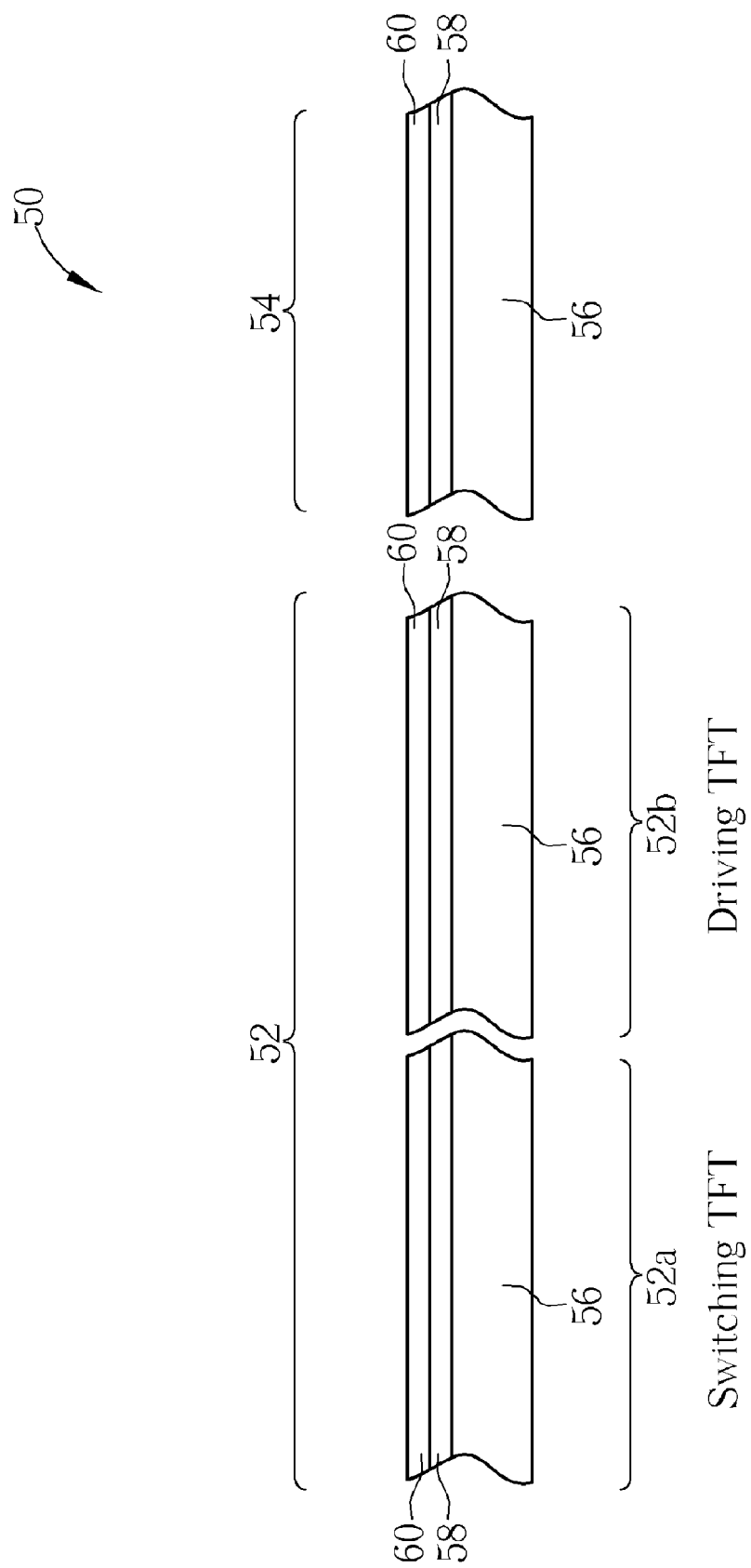
FIGS. 3-9 are schematic diagrams of sectional views of the fabrication method of the flat panel display according to the present invention.

Referring to FIGS. 3-9, FIGS. 3-9 are schematic diagrams of the sectional views of the fabrication method of the flat panel display 50 according to the present invention. As shown in FIG. 3, the flat panel display 50 comprises a pixel array area 52, and a periphery circuit area 54, wherein the pixel array area 52 comprises a plurality of sub-pixels. Each sub-pixel includes at least two TFTs in each sub-pixel. In FIG. 3, only a switching TFT region 52a and a driving TFT region 52b are defined and illustrated for explanation. First, a substrate 56 is provided, wherein the substrate 56 is a transparent glass substrate. Then, a buffer layer 58 and an amorphous silicon layer 60 are formed in the pixel array area 52 and the periphery circuit area 54 on the substrate 56 sequentially. The buffer layer 58 and the amorphous silicon layer 60 may be formed by using plasma enhanced chemical vapor deposition (PECVD) processes, wherein the buffer layer 58 can be a silicon oxide layer for insulating the semiconductor heat sinks from the amorphous silicon layer 60. After forming the buffer layer 58 and the amorphous silicon layer 60, a dehydrogenation process is performed to reduce the hydrogen content in the amorphous silicon layer 60.

Figure 4:
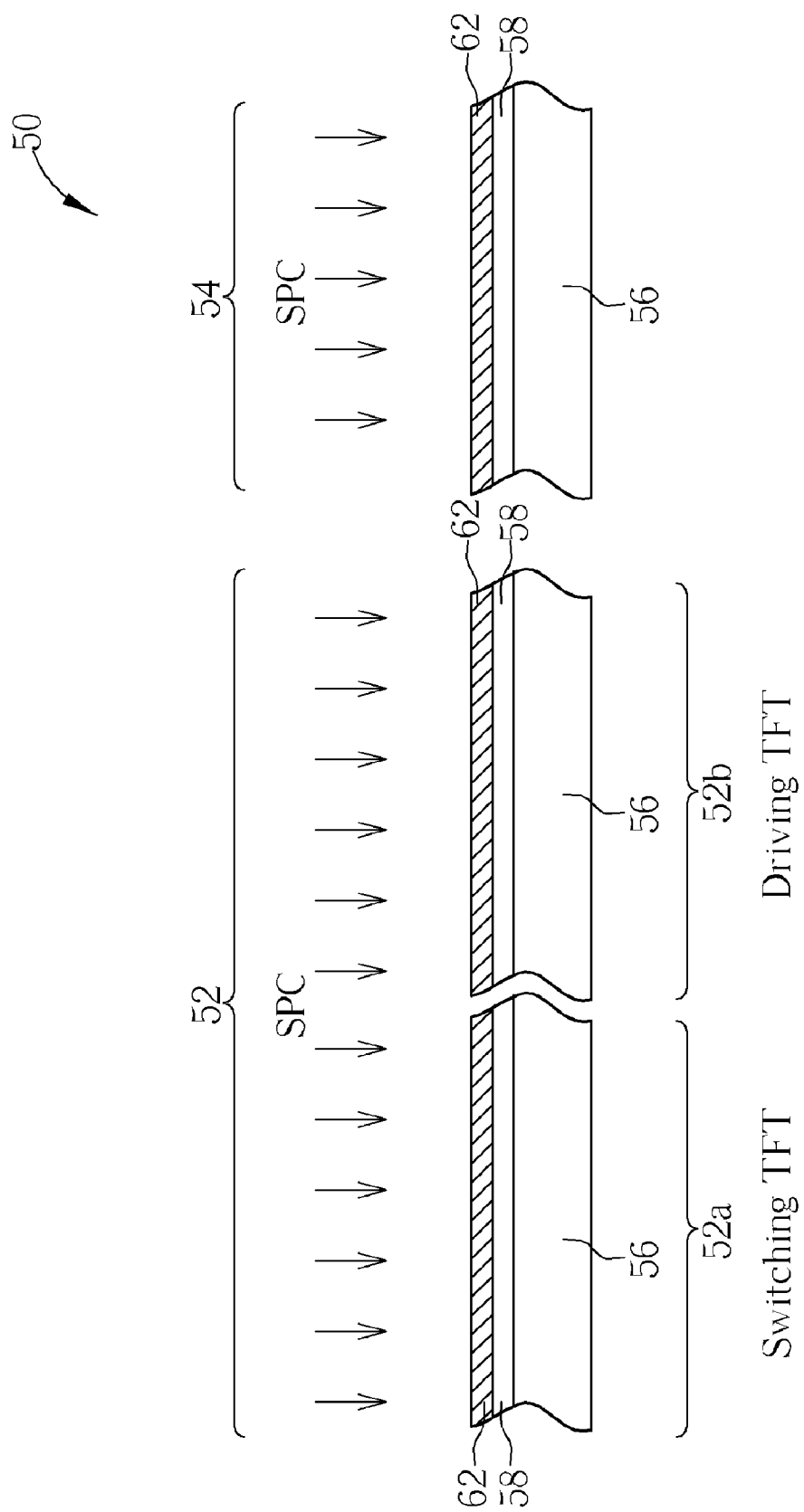

Referring to FIG. 4, a first crystallization process is performed to re-crystallize the amorphous silicon layer 60 for forming a polysilicon layer 62 on the buffer layer 58. The first crystallization process is preferably a solid-phase crystallization (SPC) process, comprising a furnace annealing process, a rapid thermal process (RTP), or an alternating magnetic field crystallization (AMFC) process. For example, when the SPC process is performed by a furnace annealing process, the substrate 52 may be heated by the furnace under 600° C. with 12-24 hours so that the amorphous silicon layer 60 is completely melted and re-crystallized to become the polysilicon layer 62 with a dendrite grain structure.

Figure 5:
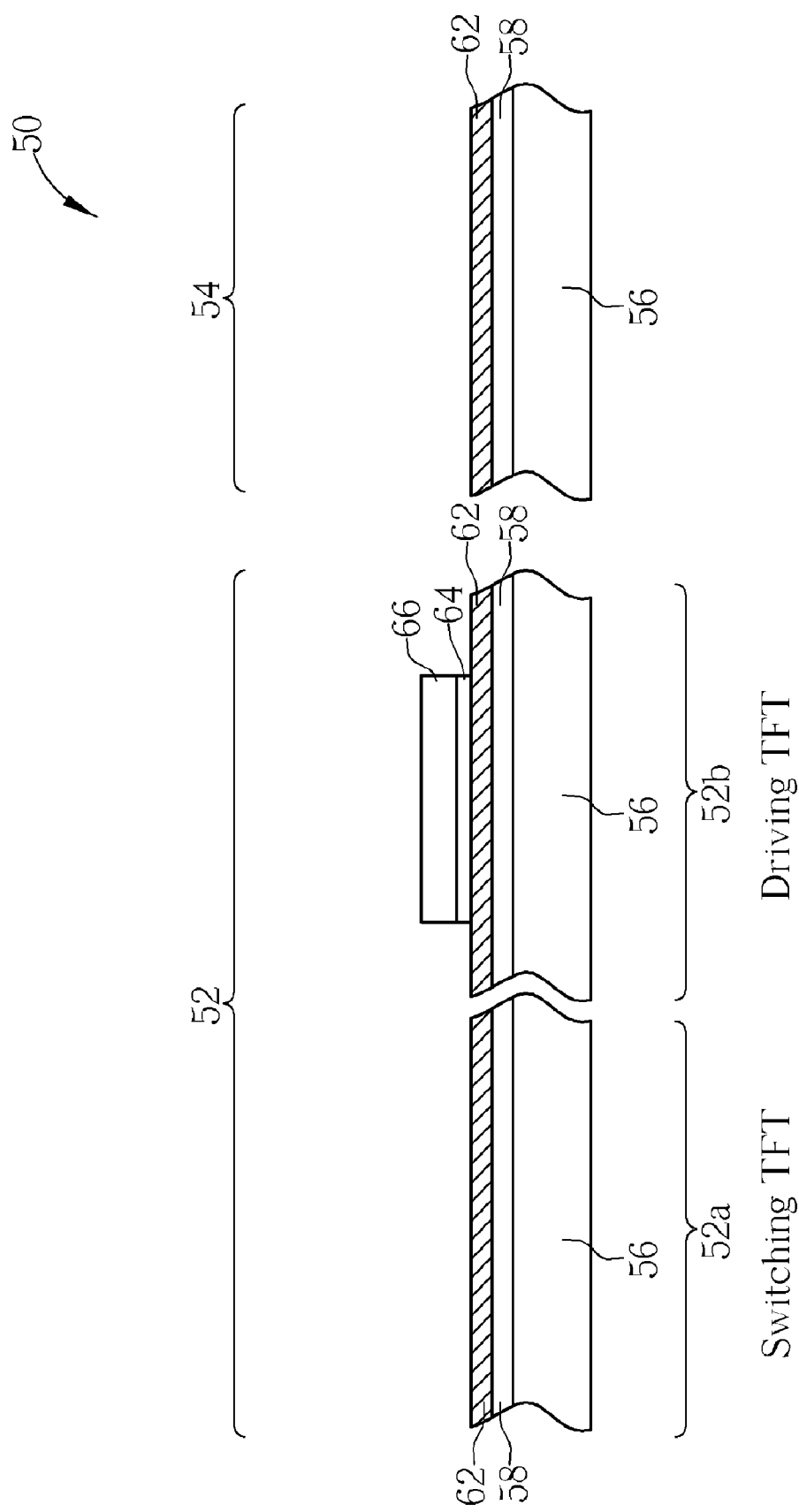

Then, an absorbing layer 64 and a photoresist layer 66 are sequentially formed on the polysilicon layer 62. A photo-etching process is performed to pattern the photoresist layer 66 and the absorbing layer 64 for defining an active area pattern in each driving TFT region 52b. Accordingly, the patterned absorbing layer 64 only covers the active area of the driving TFT following formed, while the other portions of the polysilicon layer 62 are exposed, as shown in FIG. 5. The absorbing layer 64 comprises silicon oxide or other materials that can block a laser irradiation in the following process.

Figure 6:
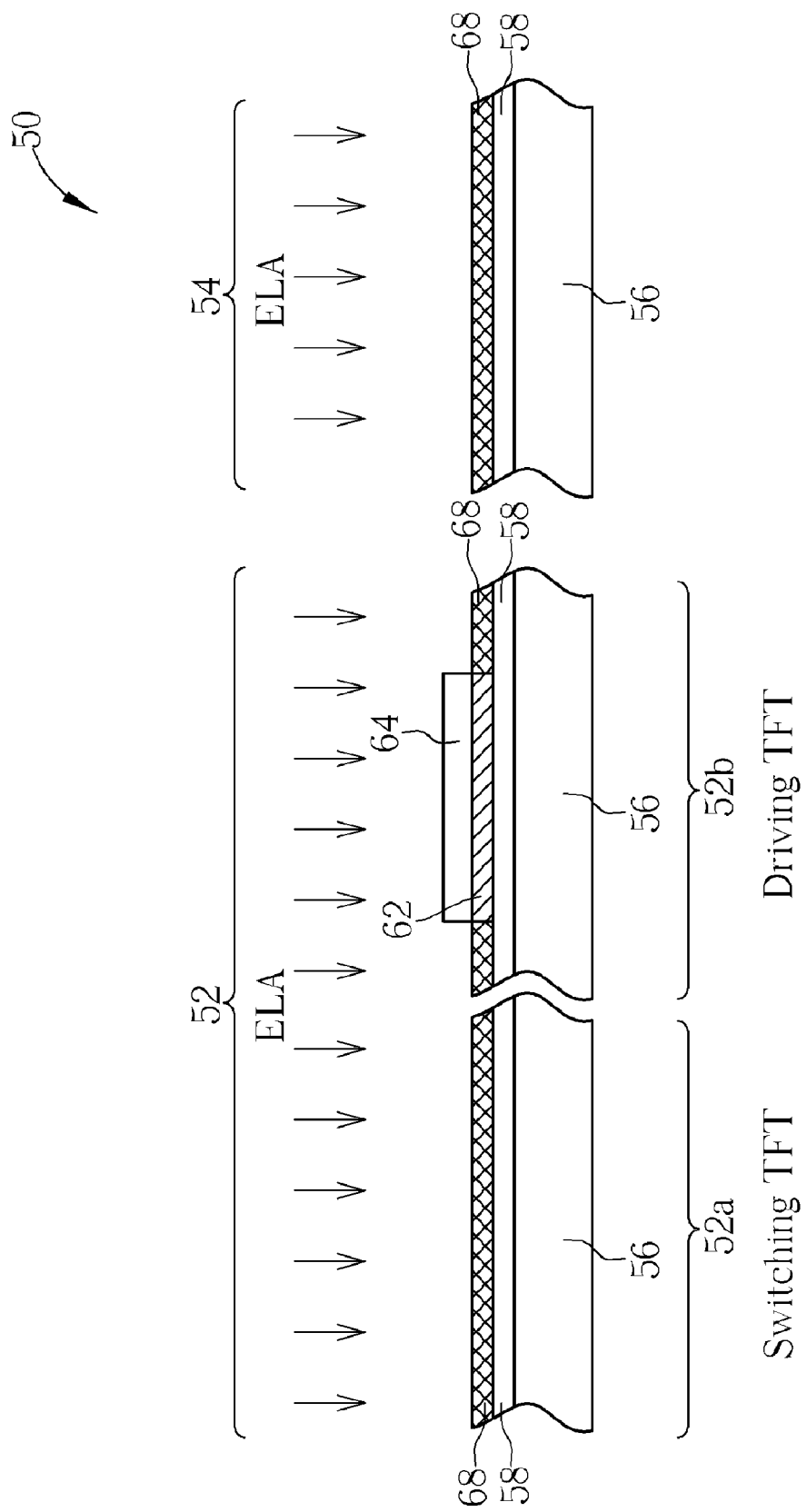

Please refer to FIG. 6. The photoresist layer 66 is selectively removed. A second crystallization process is then performed to re-crystallize the exposed portions of the polysilicon layer 62. The second crystallization process is different from the first crystallization process. In a preferable embodiment, the second crystallization process is an excimer laser annealing process, and which is practiced by an excimer laser or a solid-stated laser (SSL). During this process, the portions of the polysilicon layer 62 not covered by the absorbing layer 64 are melted and re-crystallized to become a polysilicon layer 68, while the portions of the polysilicon layer 62 covered by the absorbing layer 64 is not melted because the absorbing layer 64 blocks the laser irradiation. Since the polysilicon layer 68 is formed by the ELA process, it comprises a columnar grain structure, which has a high carrier mobility.

Figure 7:
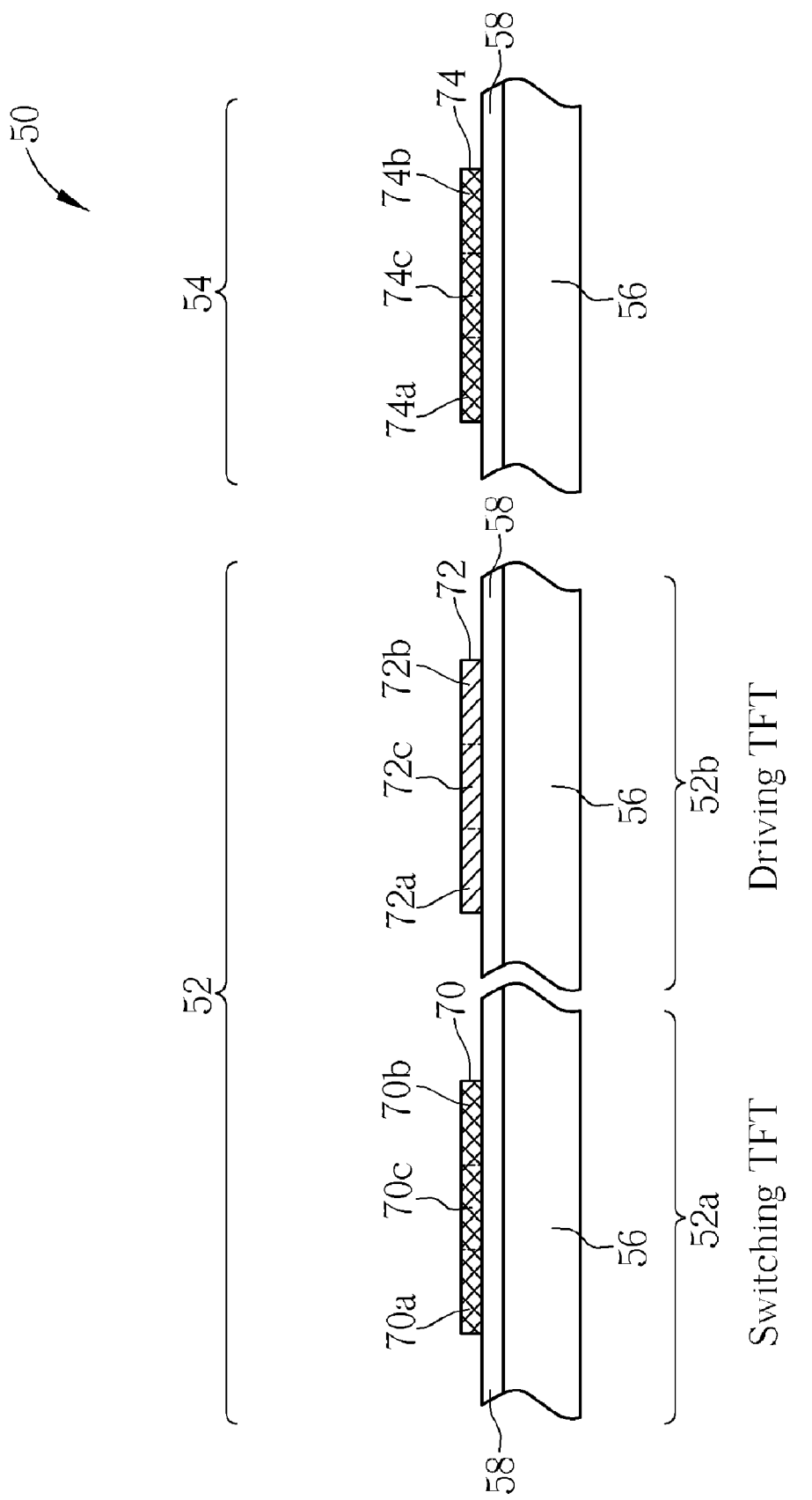

Referring to FIG. 7, the absorbing layer 64 is removed. A second photo-etching process is then performed to define the active area 70 of every switching TFT in the switching TFT regions 52a, the active area 72 of every driving TFT in the driving TFT regions 52b in all the sub-pixels and to define the active areas 74 of each peripheral driving TFTs in the periphery circuit area 54. The active areas 70, 72, 74 comprise a channel region 70c, 72c, 74c, a source region 70a, 72a, 74a, and a drain region 70b, 72b, 74b respectively.

Figure 8:
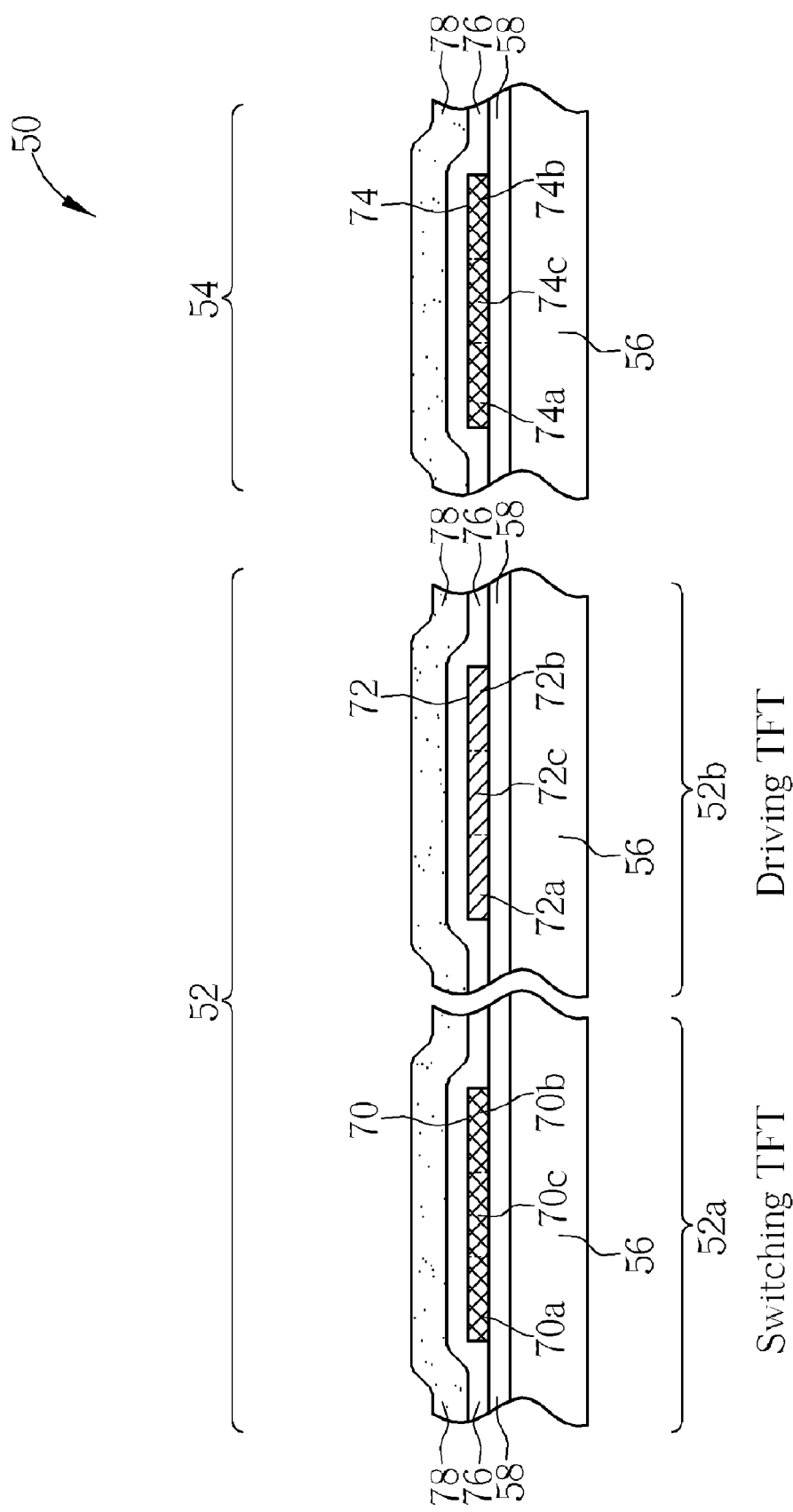

As shown in FIG. 8, a plasma enhanced chemical vapor deposition (PECVD) process is thereafter performed to form a silicon oxide layer 76 on the surface of the active areas 70, 72, 74 formed with the polysilicon layers 62, 68. The silicon oxide layer 76 serves as a gate insulating layer for separating channel regions and gates in every TFT. After that, a metal layer 78 is formed on the surface of the silicon oxide layer 76, which may be formed by a sputtering process. The metal layer 78 may be a tungsten (W) layer, a chrome (Cr) layer, or another conductive metal layer.

Figure 9:
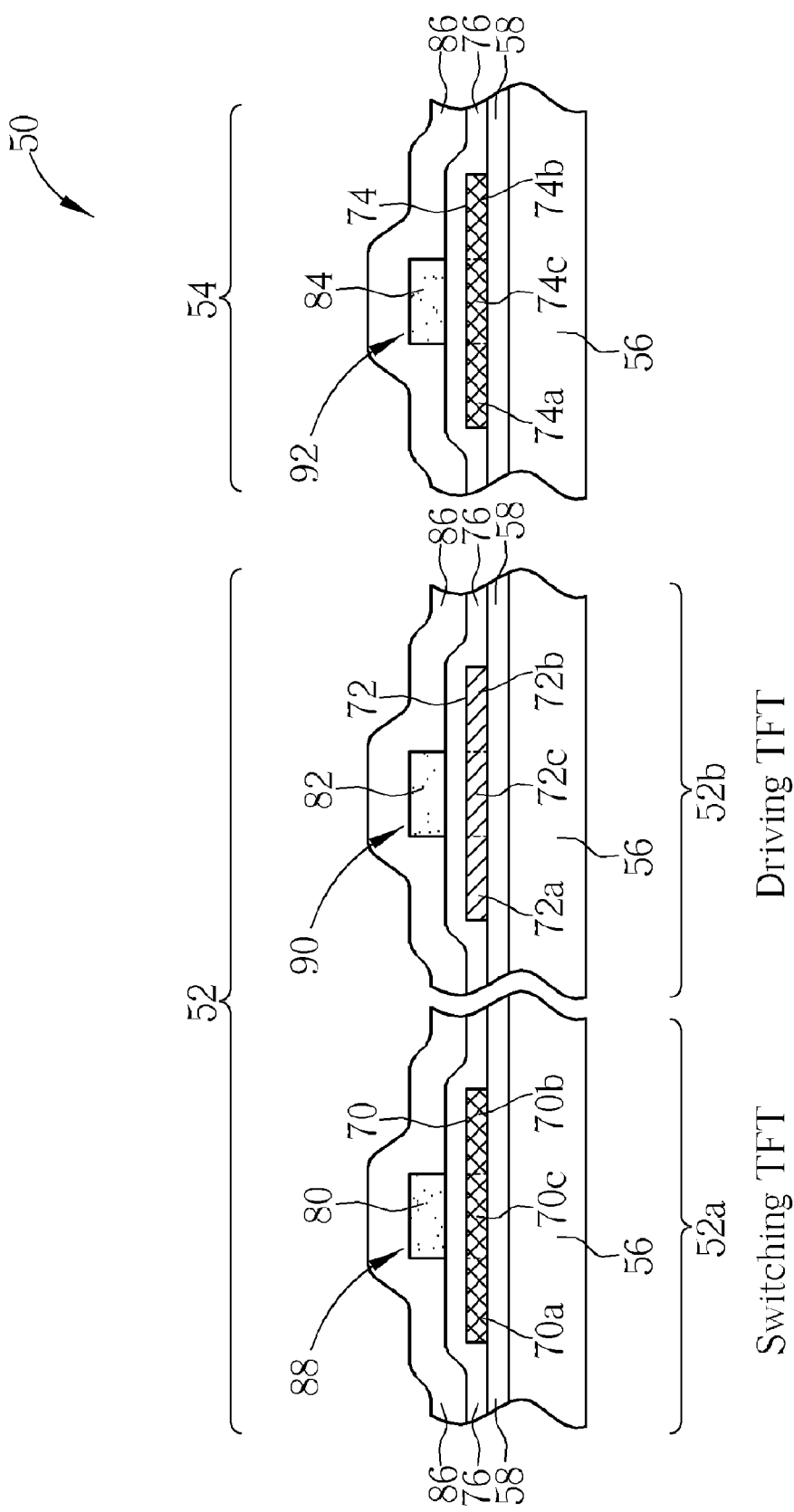

Referring to FIG. 9, a photoresist layer (not shown) is then formed on the surface of the metal layer 78. A photo-etching process is thereafter performed to define gate patterns in the photoresist layer (not shown). The gate patterns are on top of the channel regions 70c, 72c, 74c. After that, a dry etching process is performed to remove portions of the metal layer 78 so as to form gates 80, 82, 84 on top of the silicon oxide layer 76. After removing the gate patterns of the photoresist layer, an ion implantation process is selectively performed to form sources and drains of TFTs, in the source regions 70a, 72a, 74a and in the drain regions 70b, 72b, 74b of the polysilicon layer 62, 68 respectively by utilizing the gates 80, 82, 84 as implantation masks. Then, a passivation layer 86 is formed on the substrate 56. Therefore, the formation of the switching TFTs 88, the driving TFTs 90, and the peripheral driving TFTs 92 are completed in the switching TFT regions 52a, the driving TFT regions 52b, and the periphery circuit area 54 respectively.

Figure 10:
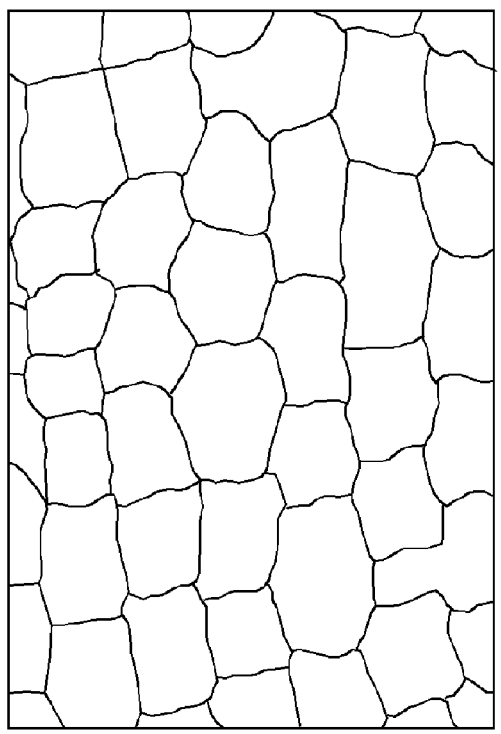
FIG. 10 is a schematic diagram of the dendrite grain structure and a columnar grain structure according to the present invention.
Figure 10:
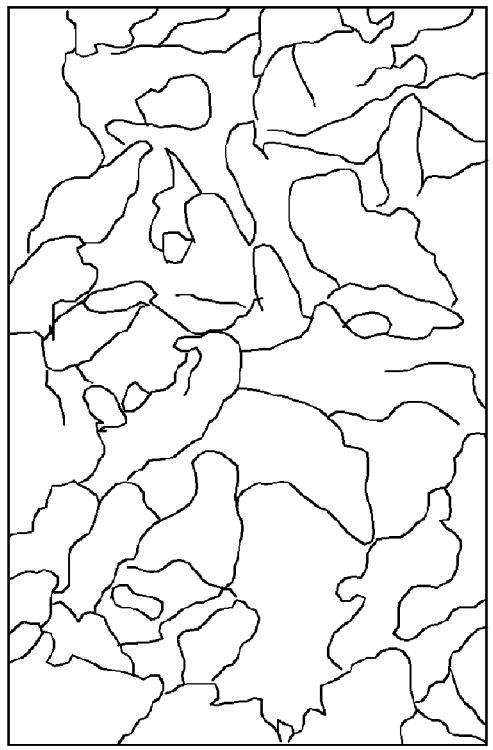

It should be noted that the grain structures of the channel regions of the driving TFTs 90 are different from the grain structures of the channel regions of the switching TFTs 88, or the peripheral driving TFTs 92 because the formation methods are different. Referring to FIG. 10, which is a schematic diagram of the dendrite and columnar grain structures. The grain structure of the channel regions of the driving TFTs 90 comprises a dendrite grain structure, which is formed by the first crystallization process, the SPC process. Although the dendrite grain structures have a low carrier mobility, about 10-40 $cm^2/V \cdot s$, they also have a small standard deviation of the carrier mobility. The driving TFTs 90 usually have large channel lengths, and require uniform driving currents and a small standard deviation to provide uniformity of the brightness in each sub-pixels, which is approximately smaller than 5 $cm^2/V \cdot s$. Therefore, the dendrite grain structures formed by the SPC process can meet the requirement of the driving TFTs 90. On the other hand, the channel regions 70c, 74c of the switching TFTs 88 and the peripheral driving TFTs 92 are columnar grain structures formed by the second crystallization process, the ELA process, and which have a high carrier mobility and a high driving current, thus the response time of each of the switching TFTs 88 and the peripheral driving TFTs 92 is short. Accordingly, the response time of the whole flat panel display 50 is preferable according to the present invention.

In contrast to the prior art, the present invention provide a flat panel display, such as a AMOLED or active matrix polymer light-emitting panel display, that has at least two grain structures of the channel regions of the TFTs, wherein the two grain structures may be included in one sub-pixel, or be included in the periphery circuit area and the pixel array area respectively. Therefore, each TFT in the sub-pixel or the periphery circuit area can have an appropriate property in operation. For example, the channel regions of the driving TFTs have a dendrite structure having a low carrier mobility and a small standard deviation of carrier mobility, thus all the sub-pixels have a preferable uniformity of the brightness. Furthermore, the low driving currents of the dendrite grain structure can extend the lifetime of the organic light-emitting elements in each sub-pixels. The present invention can be applied to various flat panel displays, even when each sub-pixel includes more than two TFTs. Those skilled in the art should know that the spirit of the present invention is to provide different and appropriate grain structures to the channel regions for TFTs with different functionalities through different fabrication processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a flat panel display, the flat panel display comprising a plurality of sub-pixels and a periphery circuit area, the method comprising:

providing a substrate;

forming an amorphous silicon layer on the substrate;

performing a first crystallization process to crystallize the amorphous silicon layer so that the amorphous silicon layer becomes a polysilicon layer;

forming a patterned absorbing layer to cover an active area pattern of a driving thin film transistor (TFT) in each of the sub-pixels and to expose portions of the polysilicon layer;

performing a second crystallization process to re-crystallize the exposed portions of the polysilicon layer so that a grain structure of the exposed portions of the polysilicon layer is different from a grain structure of a plurality of active areas covered by the active area patterns of the driving TFTs;

removing the patterned absorbing layer; and removing portions of the polysilicon layer to form the active area of the driving TFT and to form an active area of a switching TFT in the exposed portions of the polysilicon layer of each sub-pixel, and to form at least an active area of a peripheral driving TFT in the periphery circuit area;

wherein each of the active areas comprises a channel region, a source region, and a drain region, and the grain structure of a channel region of the peripheral driving TFT in the periphery circuit area is the same as the grain structure of the channel region of the switching TFT in each of the sub-pixels.

2. The method as claimed in claim 1, wherein the method further comprises:
   forming a gate insulating layer and a metal layer on the substrate sequentially; and
   removing portions of the metal layer to form a plurality of gates of the switching TFTs and the driving TFTs.

3. The method as claimed in claim 1, wherein the first crystallization process comprises a solid-phase crystallization (SPC) process.

4. The method as claimed in claim 3, wherein the SPC process comprises a furnace annealing process, a rapid thermal process (RTP), or an alternating magnetic field crystallization (AMFC) process.

5. The method as claimed in claim 1, wherein the second crystallization process comprises an excimer laser annealing (ELA) process.

6. The method as claimed in claim 5, wherein the ELA process comprises a solid-state laser (SSL) or an excimer laser process.

7. The method as claimed in claim 1, wherein the grain structure of the channel regions of the driving TFTs in the sub-pixels comprises a dendrite grain structure, and the grain structure of the channel regions of the switching TFTs in the sub-pixels comprises a columnar grain structure.

8. The method as claimed in claim 1, wherein the standard deviation of the carrier mobility in the channel regions of the driving TFTs in the sub-pixels is smaller than the standard deviation of the carrier mobility in the channel regions of the switching TFTs in the sub-pixels.

* * * * *